US010718900B2

(12) United States Patent
Shaw

(10) Patent No.: US 10,718,900 B2
(45) Date of Patent: Jul. 21, 2020

(54) METHOD OF PRODUCING OPTICAL WAVEGUIDES, CORRESPONDING SYSTEM AND DEVICE

(71) Applicant: STMicroelectronics S.r.l., Agrate Brianza (IT)

(72) Inventor: Mark Andrew Shaw, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/130,677

(22) Filed: Sep. 13, 2018

(65) Prior Publication Data
US 2019/0086609 A1 Mar. 21, 2019

(30) Foreign Application Priority Data

Sep. 20, 2017 (IT) .................. 102017000105367

(51) Int. Cl.
*H01L 21/67* (2006.01)
*H01L 21/822* (2006.01)
*G02B 6/122* (2006.01)
*G02B 6/25* (2006.01)
*G02B 6/12* (2006.01)
(Continued)

(52) U.S. Cl.
CPC .......... *G02B 6/122* (2013.01); *B23K 26/0624* (2015.10); *G02B 6/12004* (2013.01); *G02B 6/13* (2013.01); *G02B 6/25* (2013.01); *H01L 21/67092* (2013.01); *H01L 21/822* (2013.01); *G02B 2006/12166* (2013.01)

(58) Field of Classification Search
CPC ...... B23K 26/0624; G02B 2006/12166; G02B 6/12004; G02B 6/122; G02B 6/13; G02B 6/25; H01L 21/67092; H01L 21/822
See application file for complete search history.

(56) References Cited

U.S. PATENT DOCUMENTS 5,926,586 A 7/1999 Dragone et al.
5,999,670 A * 12/1999 Yoshimura ........... G02B 6/1221
385/31

(Continued)

FOREIGN PATENT DOCUMENTS

WO 2012006736 A2 1/2012

OTHER PUBLICATIONS

Acker, Matthew S., "The Back-End Process: Step 11—Scribe and Break", Dynatex International, downloaded from Internet on Sep. 13, 2018, http://www.dynatex.com/dtx-scribe-and-break_8_108_26213.html.

(Continued)

*Primary Examiner* — Duy T Nguyen
(74) *Attorney, Agent, or Firm* — Slater Matsil, LLP

(57) ABSTRACT

A method includes providing a semiconductor wafer that includes at least one optical waveguide extending in a longitudinal direction. Stealth dicing laser processing is applied to the semiconductor wafer by producing defect regions into the wafer along at least one cutting line. The cutting line is oblique to the longitudinal direction of the at least one optical waveguide. The wafer is expanded to induce fracture thereof at the at least one cutting line, thereby producing an end surface of the at least one optical waveguide. The end surface is oblique to the longitudinal direction of the at least one optical waveguide.

16 Claims, 3 Drawing Sheets

(51) Int. Cl.
  *B23K 26/0622* (2014.01)
  *G02B 6/13* (2006.01)

(56) References Cited

U.S. PATENT DOCUMENTS

| | | | |
|---|---|---|---|
| 7,953,305 B2 | 5/2011 | Sugiyama | |
| 9,130,057 B1 | 9/2015 | Kumar et al. | |
| 2004/0047539 A1* | 3/2004 | Okubora | G02B 6/13 385/14 |
| 2009/0067786 A1 | 3/2009 | Ohtsu et al. | |
| 2009/0067799 A1* | 3/2009 | Nakane | G02B 6/4212 385/131 |
| 2010/0104251 A1* | 4/2010 | Hodono | B29D 11/00663 385/129 |
| 2010/0278485 A1* | 11/2010 | Nakagawa | B29D 11/0075 385/38 |
| 2012/0076454 A1* | 3/2012 | Shiraishi | G02B 6/42 385/14 |
| 2013/0170803 A1* | 7/2013 | Mori | G02B 6/1221 385/124 |
| 2014/0179083 A1 | 6/2014 | Buenning et al. | |

OTHER PUBLICATIONS

Kumagai, Masayoshi, et al., "Advanced Dicing Technology for Semiconductor Wafer-Stealth Dicing", IEEE Transactions on Semiconductor Manufacturing, vol. 20, No. 3, Aug. 2007, pp. 259-265.
Kumagai, Masayoshi, et al., "Advanced dicing technology for semiconductor wafer-Stealth Dicing", Semiconductor Manufacturing, 2006, IEEE International Symposium, Piscataway, NJ, Sep. 25, 2006, pp. 215-218.
Ohmura, Etsuji, et al., "Analysis of Internal Crack Propagation in Silicon Due to Permeable Pulse Laser Irradiation: Study on Processing Mechanism of Stealth Dicing", Journal of Materials Science and Engineering A 1, David Publishing, Jun. 10, 2011, pp. 46-52.
Yadav, Amit, et al., "Stealth dicing of sapphire wafers with near infra-red femtosecond pulses", Applied Physics A, Materials Science & Processing, Apr. 25, 2017, 7 pages.
Dynatex International, "Laser Bar Cleaving for High Volume Production", downloaded from Internet on Sep. 13, 2018, http://www.dynatex.com/dtx-scribe-and-break_8_108_26213.html.
Disco Corporation, "Stealth Dicing Application", downloaded from Internet on Sep. 13, 2018, https://www.disco.co.jp/eg/solution/library/stealth.html.

* cited by examiner

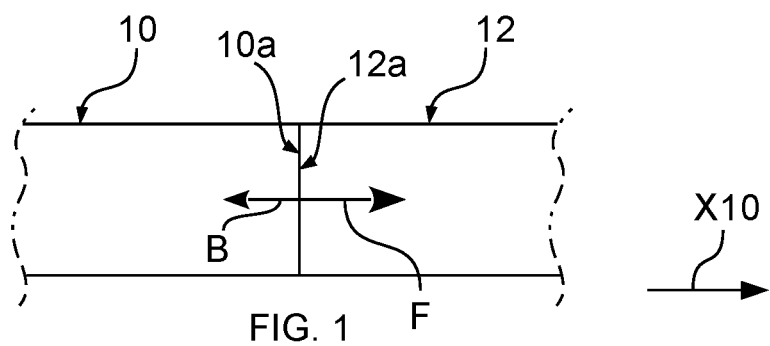
FIG. 1
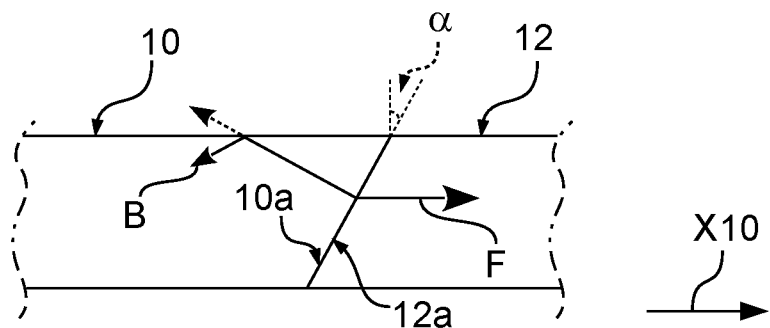
FIG. 2
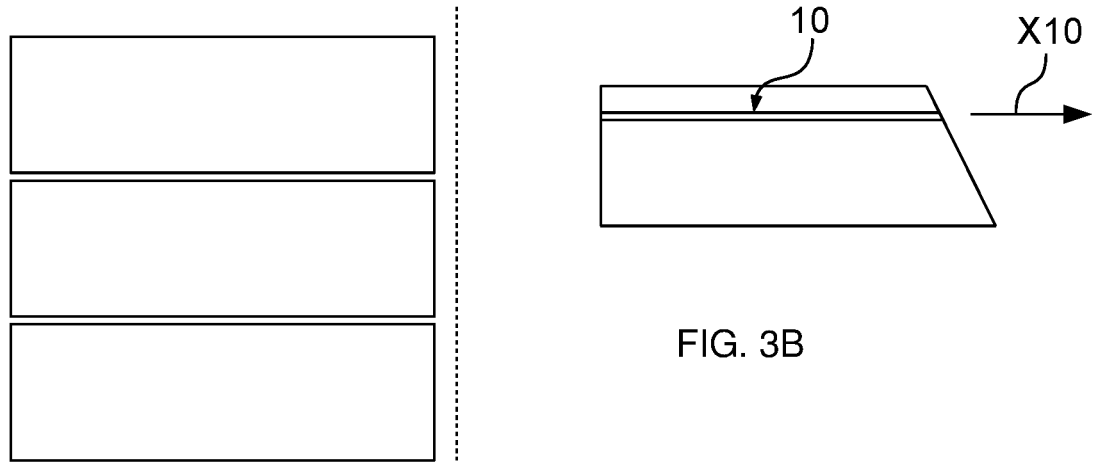
FIG. 3A
FIG. 3B

METHOD OF PRODUCING OPTICAL WAVEGUIDES, CORRESPONDING SYSTEM AND DEVICE

CROSS-REFERENCE TO RELATED APPLICATIONS

This application claims priority to Italian Patent Application No. 102017000105367, filed on Sep. 20, 2017, which application is hereby incorporated herein by reference.

TECHNICAL FIELD

The description relates to the production of optical waveguides.

BACKGROUND

Conventionally, in order to avoid back reflections during edge coupling, silicon photonics waveguides (that is, optical waveguides which use silicon as an optical medium) are diced perpendicular to a top surface of the wafer and then polished to produce an end surface exhibiting optical quality that is oblique (that is, neither perpendicular nor parallel) to the longitudinal direction (axis) of the waveguide.

SUMMARY

One or more embodiments may relate to dicing waveguides having an end surface of optical quality.

One or more embodiments provide a method of waveguide dicing which facilitates overcoming various disadvantages inherent with the two-step approach discussed above (dicing plus polishing).

In one example, a semiconductor wafer includes at least one optical waveguide extending in a longitudinal direction. Stealth dicing laser processing is applied to the semiconductor wafer by producing defect regions into the wafer along at least one cutting line. The cutting line is oblique to the longitudinal direction of the at least one optical waveguide. The wafer is expanded to induce fracture thereof at the at least one cutting line, thereby producing an end surface of the at least one optical waveguide. The end surface is oblique to the longitudinal direction of the at least one optical waveguide.

One or more embodiments may include a corresponding system as well as a corresponding device (e.g. a waveguide having optical quality angled end surfaces).

BRIEF DESCRIPTION OF THE DRAWINGS

One or more embodiments will now be described, by way of example only, with reference to the annexed figures, wherein:

FIGS. 1 and 2 are exemplary of coupling between two waveguides having straight and angled end surfaces, respectively;

FIGS. 3A and 3B, collectively FIG. 3, are exemplary of a process for producing an arrangement including a waveguide as exemplified in FIG. 2;

DETAILED DESCRIPTION OF ILLUSTRATIVE EMBODIMENTS

Figure 4:
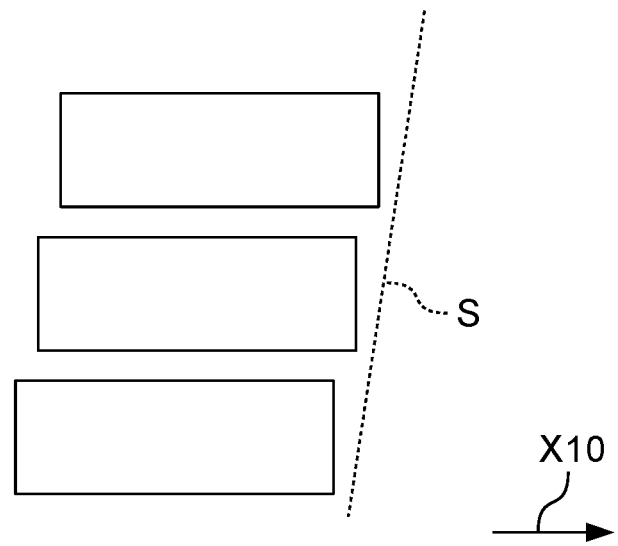
FIG. 4 is exemplary of a possible development of the process of FIG. 3.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

FIG. 1 represents edge coupling between two optical waveguides, 10 and 20.

In one or more embodiments, each waveguide may include a semiconductor (e.g., silicon) as an optical medium or either waveguide 10 or waveguide 20 may be an optical fiber. The "silicon photonics" waveguides 10 and 20 of FIG. 1 have "straight" end surfaces 10a, 12a, namely end surfaces extending orthogonal to the direction of light propagation, that is, the longitudinal direction (axis) of the waveguides 10, 12, here indicated as X10.

In addition to a "forward" component F of light propagation (left-to-right, from waveguide 10 to waveguide 20 in the figure) a "back reflection" component B (right-to-left, from waveguide 20 to waveguide 10 in the figure) exists which remains within the waveguide 10, thereby producing high return losses.

FIG. 2 represents two waveguides 10 and 20 having end surfaces 10a,12a that are oblique (inclined) with respect to the direction of light propagation X10, that is angled of e.g. an angle α different from 0 with respect to the axis perpendicular the direction X10 (and to a top surface of the waveguides). In FIG. 2, parts or elements like parts or elements already discussed in connection with FIG. 1 are indicated with like references, thus making it unnecessary to repeat a corresponding description.

Under these conditions, a portion of the back reflection B, as represented with a dashed line in FIG. 2, may be transmitted outside of the waveguide 10, which in turn may lead to reduced return losses, due to a portion of the light not being propagated back within the waveguide.

FIG. 3, which includes FIGS. 3A and 3B, exemplifies how waveguides corresponding to an arrangement as exemplified in FIG. 2 can be produced by cutting a single waveguide or an array of waveguides at a vertical angle, and by subsequent polishing, singly or for an array of waveguides, possibly followed by a further lateral dicing step.

That is, FIG. 3 exemplifies a dicing step (FIG. 3A) perpendicular to a top surface of the wafer and to the longitudinal direction X10 (e.g., α=0, as shown in FIG. 1), and a polishing step (FIG. 3B) to produce a waveguide 10 with an oblique end surface exhibiting optical quality (e.g., as shown in FIG. 2);

FIG. 4 exemplifies a lateral angle (e.g. α=8°) dicing step, followed by a polishing step which may be performed singly for each waveguide or for an array of waveguides.

That is, FIG. 4 shows, by way of comparison with FIG. 3A, that polishing may be facilitated by a first dicing step performed on a layered structure (array) of plural dice or chips already mutually offset along a "staggering" line S corresponding to a desired angle of inclination of the end surface of the waveguide 10.

The polishing step, applied either to the single die or an array of dice, is a time consuming and costly technique, and does not represent a standard semiconductor process.

Solutions which may permit to avoid a polishing step following a dicing step are desirable.

In that respect, the following was observed. Obtaining a consistent end surface of optical quality using a dicing saw blade may be difficult. A possible method of waveguide dicing may include cleaving, a technique where a surface mechanical groove is made and the wafer may be split along the groove mark. Such a technique may rely on the propagation of cracks along a crystal structure of the waveguide. Machinery as disclosed, e.g., such as shown in http://www.dynatex.com/dtx-scribe-and-break_8_108_26213.html may be used to automate this process. Also, currently no cleaver is in production which may be able to operate on a 12" wafer and, more to the point, an angled cleave may be difficult to obtain.

It was similarly observed that generating grooves in a front surface of a device or chip may be hardly feasible, insofar as the optical waveguide is located proximal to such surface. Backside grooving, i.e., generating grooves on the back surface of the device or chip, appears to be possible, while cracks may propagate in a different direction with respect to a desired direction.

One or more embodiments may involve using so-called "stealth" dicing. Stealth dicing permits to use a laser to locally heat material within a wafer, causing localized damage therein. The wafer may then be expanded and may crack along lines of local thermal damages.

Stealth dicing processing involves producing defect regions into a wafer by scanning a laser beam along intended cutting lines, with subsequent expansion of the wafer (e.g. carried by an underlying membrane) to induce fracture.

General information on stealth dicing is available, e.g., at https://www.disco.co.jp/eg/solution/library/stealth.html, which indicates, inter alia, that stealth angled dicing may be used to dice in a different direction with respect to the crystal plane, as shown by so-called "Hasen cut" dicing of an hexagonal die. A Hasen cut is a method that cuts while repetitively turning the laser ON/OFF at a set cycle during laser processing. It is possible to process various shapes depending on the ON/OFF setting.

Also, machinery for stealth dicing is commercially available with the DISCO Corporation of Tokyo, Japan.

In one or more embodiments, stealth dicing may be applied by providing a number of thermal damaged layers, with one or more of such layers that may be located at an optical waveguide, e.g., in close proximity to it, located within the wafer.

This may facilitate avoiding microcracks at the waveguide surface and may facilitate ensuring that the cracks are generated in the wafer in the correct orientation. Such microcracks may be caused, e.g., by a thermal shock wave; however, by adjusting power intensity and number of laser passes (that is the number of local thermal damage areas or regions which may be produced at different depths: each pass is made with the laser focused at a different depth in order to facilitate crack propagation in a local thermal damage line, i.e., a line that follows the different layers of thermal damage), the microcracks can be reduced in order to obtain waveguide surfaces of optical quality. This may facilitate generating an end surface of a device or a chip by providing multiple passes of applied laser.

Also it was observed that stealth dicing with an optical quality facet is feasible and that such dicing can be performed with a "staggered" profile, i.e. with multiple waveguides in an array.

Figure 5:
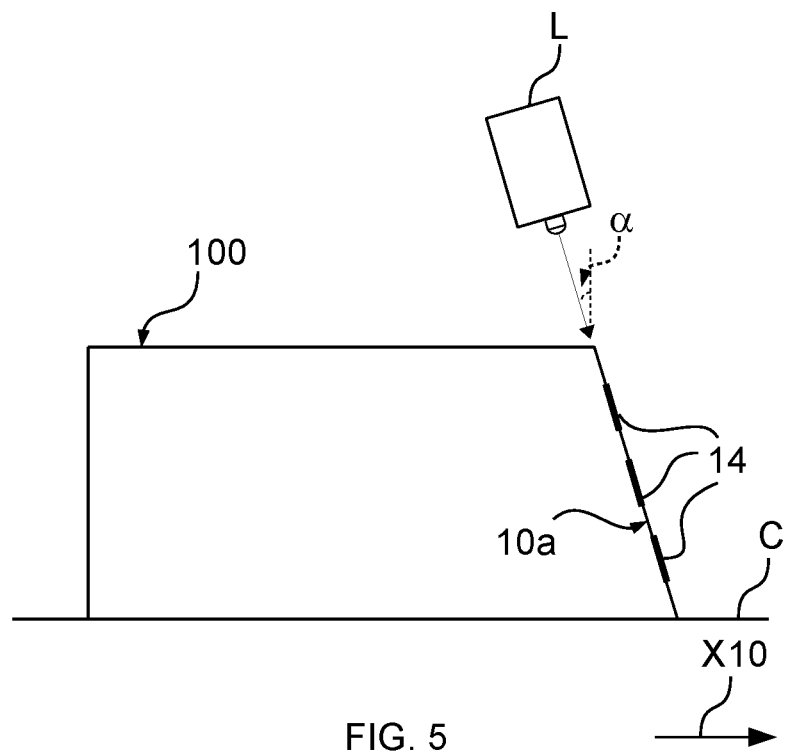
FIG. 5 is exemplary of one or more embodiments.
Figure 6:
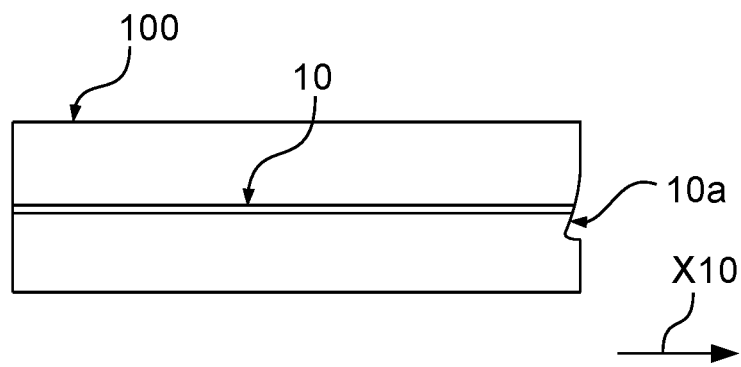
FIGS. 6 and 7 are exemplary of one or more embodiments.
Figure 7:
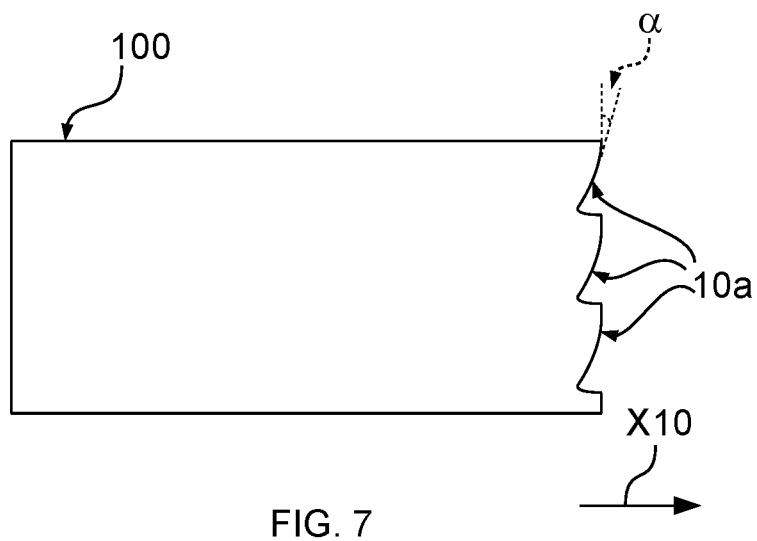

Further details concerning one or more embodiments are exemplified in FIGS. 5 to 7.

In FIGS. 5 to 7, parts or elements like parts or elements already discussed in connection with FIGS. 1 and 2 are indicated with like references; a corresponding description will not be repeated here for brevity.

FIG. 5 exemplifies the possibility of producing a device or chip 100 via (angled) stealth dicing technique, wherein the chip 100 may have optical quality end surfaces.

In one or more embodiments as exemplified in FIG. 5, radiation from a stealth dicing laser source L (e.g., as mentioned in the foregoing), exemplified by an arrow, may be applied to the device or chip 100 (supported by a carrier C, such as a membrane), e.g., along a line at an angle α with respect to the perpendicular axis to the top surface of the device 100 in order to provide an "angled" (that is oblique or inclined) end surface 10a for an optical waveguide.

In one or more embodiments, the angle α may have an (absolute) value of about 8°.

Highlighted portions 14 in FIG. 5 are representative of "modification spots" wherein local thermal damage may be produced as a result of stealth dicing laser processing.

In one or more embodiments using current stealth dicing laser technology (e.g. with elliptical beams) these spots 14 may take the form of elongated areas and laser dicing laser processing may progress at an angle (that is oblique or inclined) with respect to the semiconductor wafer.

In one or more embodiments using stealth dicing laser technology providing (highly) localized (e.g., circular) laser spots, "vertical" (or orthogonal) dicing may be adopted by producing, e.g., circular damaged areas that can be staggered (and possibly overlapped) so as to form an angled damage line that would crack at an angle.

Such an approach can be adopted either by using an angle chuck or simply by angling the laser beam mirror. Also, dicing lasers are currently being developed capable of obtaining circular spot sizes.

Also, one or more embodiments may involve software adaptation in order to facilitate correct tracking of the wafer surface by the laser beam.

In any case, whatever the approach adopted to produce the "damaged" line therein, once the wafer 100 is expanded (e.g., by expanding the carrier C), it may be possible to produce an angled (oblique, inclined) end surface 10a retains an optical quality.

It was also observed that the "Hasen cut" technique mentioned previously can be used to produce the angled facet or end surfaces only for the width of the optical waveguide, or optical waveguides, located within the device. This may provide one or more advantages, e.g., it may be possible to produce a number of waveguides exhibiting the same length.

FIGS. 6 and 7 exemplify one or more embodiments wherein indents including one or more angled facets 10a for one or more waveguides 10 are produced within a device or chip 100 by resorting to stealth dicing as discussed previously. In other words, FIGS. 6 and 7 illustrate an end surface having physical characteristics of a stealth dicing laser cut end surface.

A generated indent may exhibit an angle α of, e.g., 8° with respect to the perpendicular axis to a top surface of the device 100. The same technique may be applied both for a single and a multiple waveguide device.

One or more embodiments may thus relate to a method, including providing a semiconductor wafer (e.g., 100) including at least one optical waveguide (e.g., 10) extending in a longitudinal direction (e.g., X10); applying stealth dicing laser processing (e.g., L) to the semiconductor wafer by producing defect regions (e.g., 14) into the wafer along at least one cutting line, wherein the cutting line is oblique, i.e., neither parallel nor perpendicular, to the longitudinal direction of the at least one optical waveguide; and expanding the wafer to induce fracture thereof at the at least one cutting line, thereby producing an end surface (e.g., 10a) of the at least one optical waveguide, the end surface oblique, i.e. neither perpendicular nor parallel, to the longitudinal direction of the at least one optical waveguide.

In one or more embodiments, the method may also include applying stealth dicing laser processing (e.g., L) by providing thermal damaged layers, with at least one of the layers located at the at least one optical waveguide, for example in close proximity thereto.

In one or more embodiments, the method may include adjusting at least one of the power intensity and/or the number of laser passes of stealth dicing laser processing to provide good optical quality of the end surface of the at least one optical waveguide.

In one or more embodiments, the method may include applying stealth dicing laser processing to a staggered arrangement of a plurality of semiconductor wafers to provide end surfaces of a plurality of optical waveguides therein.

In one or more embodiments, wherein producing defect regions may include producing elongated defect regions extending along the at least one cutting line and/or producing localized defect regions staggered along the at least one cutting line.

Also, the method according to one or more embodiments may include producing defect regions into the wafer along at least one cutting line providing an indent (e.g., 10a in FIGS. 6 and 7) at the surface of the expanded semiconductor wafer.

In one or more embodiments, the method may also include applying stealth dicing laser processing by producing defect regions into the wafer along at least one cutting line extending across the width of the at least one optical waveguide.

In one or more embodiments, the method may include applying stealth dicing laser processing (L) by producing defect regions (14) into the wafer (100) along a plurality of parallel cutting lines.

One or more embodiments may also relate to a system that includes a semiconductor wafer carrier (e.g. C) configured for supporting a semiconductor wafer (e.g. 100) including at least one optical waveguide extending in a longitudinal direction; a stealth dicing processing laser source (e.g. L) configured for applying stealth dicing laser processing to the semiconductor wafer supported by the carrier by producing defect regions into the wafer along at least one cutting line, wherein the cutting line is oblique to the longitudinal direction of the at least one optical waveguide; and the carrier expandable to expand the wafer to induce fracture thereof at the at least one cutting line, thereby producing an end surface of the at least one optical waveguide, the end surface oblique to the longitudinal direction of the at least one optical waveguide.

One or more embodiments may also relate to an optoelectrical device including a semiconductor wafer (e.g., 100) including at least one optical waveguide (e.g., 10) extending in a longitudinal direction, the optical waveguide having a stealth dicing laser cut end surface (e.g., 10a) oblique to the longitudinal direction of the at least one optical waveguide, wherein the end surface of the at least one optical waveguide may be produced with the method according to one or more embodiments.

Without prejudice to the underlying principles, the details and embodiments may vary, even significantly, with respect to what has been disclosed by way of example only, without departing from the extent of protection.

The extent of protection is defined by the annexed claims.

What is claimed is:

1. A method, comprising:
providing a semiconductor wafer that includes an optical waveguide extending in a longitudinal direction and a top surface having a surface normal oriented along a vertical direction;
applying stealth dicing laser processing to the semiconductor wafer to produce defect regions into the semiconductor wafer along a cutting line, wherein the cutting line is oblique to the longitudinal direction of the optical waveguide and oblique to the vertical direction; and
forming an end surface of the optical waveguide by expanding the semiconductor wafer to cleave the semiconductor wafer through the cutting line, the end surface of the optical waveguide being oblique to the longitudinal direction of the optical waveguide and oblique to the vertical direction, wherein applying the stealth dicing laser processing comprises applying stealth dicing laser processing to a staggered arrangement of a plurality of semiconductor wafers to provide end surfaces of a plurality of optical waveguides therein.

2. The method of claim 1, wherein applying the stealth dicing laser processing comprises providing spots with local thermal damage, wherein at least one of the spots is located at the optical waveguide.

3. The method of claim 1, wherein applying the stealth dicing laser processing comprises adjusting a power intensity or a number of laser passes of stealth dicing laser processing to provide optical quality of the end surface of the optical waveguide.

4. The method of claim 1, wherein applying the stealth dicing laser processing comprises producing elongated defect regions extending along the cutting line.

5. The method of claim 1, wherein applying the stealth dicing laser processing comprises producing localized defect regions staggered along the cutting line.

6. The method of claim 1, wherein applying the stealth dicing laser processing comprises producing defect regions into the semiconductor wafer along at least one cutting line providing an indent at the end surface of the expanded semiconductor wafer.

7. The method of claim 1, wherein applying the stealth dicing laser processing comprises producing the defect regions into the semiconductor wafer along the cutting line extending across a width of the optical waveguide.

8. The method of claim 1, wherein the semiconductor wafer includes a plurality of optical waveguides, the method producing, for each optical waveguide, an end surface that is oblique to the longitudinal direction of the optical waveguide.

9. The method of claim 1, wherein applying the stealth dicing laser processing comprises producing defect regions into the semiconductor wafer along a plurality of parallel cutting lines.

10. An opto-electrical device produced by the method of claim 9.

11. A method of producing an opto-electrical device, the method comprising:
providing a semiconductor wafer carrier configured to support a semiconductor wafer comprising a surface normal oriented along a vertical direction, wherein the semiconductor wafer carrier is expandable to expand the semiconductor wafer;
locating the semiconductor wafer on the semiconductor wafer carrier, the semiconductor wafer including an optical waveguide extending in a longitudinal direction;
using a stealth dicing processing laser source to apply stealth dicing laser processing to the semiconductor wafer to produce defect regions into the semiconductor wafer along a cutting line, wherein the cutting line is oblique to the longitudinal direction of the optical waveguide and oblique to the vertical direction; and
forming an end surface of the optical waveguide by expanding the semiconductor wafer to induce fracture thereof at the cutting line, the end surface being oblique to the longitudinal direction of the optical waveguide and oblique to the vertical direction, wherein applying the stealth dicing laser processing comprises applying stealth dicing laser processing to a staggered arrangement of a plurality of semiconductor wafers to provide end surfaces of a plurality of optical waveguides therein.

12. The method of claim 11, wherein applying the stealth dicing laser processing comprises providing spots with local thermal damage, wherein at least one of the spots is located at the optical waveguide.

13. The method of claim 11, wherein the semiconductor wafer includes a plurality of optical waveguides, the method producing, for each optical waveguide, an end surface that is oblique to the longitudinal direction of the optical waveguide.

14. A method, comprising:
providing a semiconductor wafer comprising a major surface having a surface normal oriented at a first direction and an optical waveguide extending in a second direction perpendicular to the first direction;
attaching the semiconductor wafer to a carrier;
applying stealth dicing laser processing to the semiconductor wafer to produce defect regions within the semiconductor wafer, the defect regions oriented along a cutting line in a third direction, wherein the third direction is inclined relative to the first direction and the second direction; and
expanding the carrier to dice the semiconductor wafer along the cutting line to form an end surface of the optical waveguide, the end surface being oblique to the first direction and being oblique to the second direction of the optical waveguide, wherein the end surface includes a plurality of indents that each exhibit a surface inclined at an angle of about eight degrees with respect to the first direction.

15. The method of claim 14, wherein the end surface includes a plurality of indents that each exhibit a surface inclined with respect to the first direction.

16. The method of claim 14, wherein applying stealth dicing laser processing comprises producing elongated defect regions extending along the cutting line.

* * * * *